United States Patent
Hirakawa et al.

(10) Patent No.: US 7,557,593 B2
(45) Date of Patent: Jul. 7, 2009

(54) PROBE FOR ELECTRICAL TEST AND PROBE ASSEMBLY

(75) Inventors: Hideki Hirakawa, Hirosaki (JP); Akira Souma, Hirakawa (JP); Takayuki Hayashizaki, Hirakawa (JP); Shinji Kuniyoshi, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 348 days.

(21) Appl. No.: 11/627,900

(22) Filed: Jan. 26, 2007

(65) Prior Publication Data

US 2007/0210813 A1 Sep. 13, 2007

(30) Foreign Application Priority Data

Mar. 7, 2006 (JP) .............................. 2006-060551

(51) Int. Cl.
- *G01R 1/067* (2006.01)
- *H01R 12/00* (2006.01)
- *H01R 4/02* (2006.01)

(52) U.S. Cl. .......................... 324/754; 439/83; 439/876
(58) Field of Classification Search ......... 324/754–765, 324/158.1; 439/83, 876; 174/260
See application file for complete search history.

(56) References Cited

U.S. PATENT DOCUMENTS

| | | | | |
|---|---|---|---|---|
| 3,989,331 A | * | 11/1976 | Hanlon | 439/70 |
| 4,087,906 A | * | 5/1978 | Cobaugh et al. | 29/885 |
| 4,563,640 A | * | 1/1986 | Hasegawa | 324/762 |
| 5,334,804 A | * | 8/1994 | Love et al. | 174/267 |
| 5,453,017 A | * | 9/1995 | Belopolsky | 439/83 |
| 5,934,951 A | * | 8/1999 | Lai et al. | 439/876 |
| 5,957,736 A | * | 9/1999 | Moriuchi et al. | 439/876 |
| 6,049,039 A | * | 4/2000 | Fushimi | 174/68.1 |
| 6,300,678 B1 | * | 10/2001 | Suehiro et al. | 257/697 |
| 6,712,625 B2 | * | 3/2004 | Saito et al. | 439/83 |
| 7,080,451 B2 | * | 7/2006 | Saito et al. | 29/874 |
| 2004/0224541 A1 | * | 11/2004 | Kato et al. | 439/83 |

FOREIGN PATENT DOCUMENTS

| | | |
|---|---|---|
| JP | 2004340654 | 12/2004 |
| JP | 2006337229 | 12/2006 |

* cited by examiner

*Primary Examiner*—Ernest F Karlsen
(74) *Attorney, Agent, or Firm*—Ingrassia Fisher & Lorenz, P.C.

(57) ABSTRACT

A probe for electrical test comprises a probe body having a base end attached to a support base plate through a solder and a front end continuous with said base end and a surface layer showing a conductivity higher than that of the probe body and a solder wettability higher than that of the probe body and extending on the surface of the probe body from the base end to the front end. In the vicinity of the base end of the surface layer, a shield region having a smaller solder wettability than that of the surface layer is formed across the surface layer.

9 Claims, 7 Drawing Sheets

PROBE FOR ELECTRICAL TEST AND PROBE ASSEMBLY

TECHNICAL FIELD

The present invention relates to a probe and a probe assembly suitable for use in an electrical test of a semiconductor apparatus such as a semiconductor integrated circuit.

BACKGROUND

Semiconductor devices such as a plurality of semiconductor integrated circuits formed on each chip region of a semiconductor wafer are subjected to an electrical test for determining whether or not each one is produced as per specification. In an electrical test of this type, a probe assembly generally called a probe card is used. When a plurality of probes (contacts) provided on a probe base plate of this probe assembly are pressed against the corresponding electrodes of a device under test, the device under test is connected to a tester for electrical test through the probe assembly.

Among probes of a probe assembly of this type, there is a blade-type one formed by using a photolithography technique (Japanese Patent Appln. Public Disclosure No. 2004-340654). This blade-type probe includes a plate-like blade body. The plate-like blade body has a mounting portion on a support base plate, a rising portion which rises from the mounting portion, and an arm portion extending laterally from the rising portion on a plane which includes this rising portion. At the front end of the arm portion of the blade body, a tip projecting from the side opposing the side where the mounting portion is located is formed. In order to surely press the tip against an electrode of a device under test, the blade body is generally made of a highly tenacious (flexible) metal material such as nickel and its alloy. However, because of comparatively high electrical resistance, such a metal material has a problem in accurate repeatability of a rectangular wave signal used for an electrical test.

Thus, the Applicant of this Application proposed earlier, as shown in FIG. 8 in Japanese Patent Application 2005-163546 or International Patent Application PCT/JP2005/014871, to cover the surface of the body 2 of a probe 1 with a rolled gold layer 3 to make this rolled gold layer 3 function as an electrically conducting path, thereby to lower the electrical resistance of the probe.

Compared with a metal material which forms the probe body 2, the rolled gold layer 3 is superior in wettability relative to a solder 4 such as tin or tin alloy, and this rolled gold layer 3 covers the surface of the probe body 2. Thus, when the solder 4 is used to combine the probes 1 with a wiring path 5 provided on the support base plate of the probe assembly, the wettability of the rolled gold layer 3 sometimes causes the solder 4 to spread farther than required in a direction (upward in FIG. 8) to be away from a base end combining the probe body 2 with the wiring path 5.

Such an excessive spread of the solder 4 due to the wettability of the rolled gold layer 3 complicates formation of an adequate fillet shape for the solder 4 to display a stable bond strength and becomes a bar to the stable bond strength between the probes and the support base plate where the probes are to be soldered.

BRIEF SUMMARY

An object of the present invention is, therefore, to provide a probe and a probe assembly which can be surely soldered onto a support base plate.

The present invention relates to a probe for electrical test provided with: a probe body having a front end continuous with a base end which is mounted on a support base plate through a solder and a front end continuous with the base end; a surface layer showing a conductivity higher than the conductivity of the probe body and a solder wettability higher than the wettability of the probe body, and extending on the surface of the probe body from the base end to the front end, and is characterized in that, in the vicinity of the base end of the surface layer, a shield region is formed across the surface layer, the shield region having a smaller solder wettability than that of the surface layer.

According to the probe of the present invention, the shield region formed across the surface layer prevents the solder from spreading due to the wettability of the surface layer excessively to be away from the base end which is a connection end to the support base plate. This enables the solder to retain a proper fillet shape at a soldered portion of the probe to surely solder the probe onto the support base plate, whereby a stable solder bond strength therebetween can be obtained.

It is possible to provide in the probe body with a mounting portion including the base end and a rising portion extending from the mounting portion to the side opposing the side where the base end is located to be continuous with the tip. In this case, a spread of the solder wetting from the mounting portion to the rising portion can be surely prevented by forming the shield region in the vicinity of the rising portion in the mounting portion.

The probe body can be formed like a flat plate such that the mounting portion and the rising portion are formed to be flush with each other. Along at least one face of this flat plate-like probe body, the surface layer can be continuously formed from the mounting portion to the rising portion.

The solder can be preformed as a solder layer on the surface layer prior to mounting the probe body on the support base plate closer to the base end side than to the shield region in the mounting portion. As such a solder layer, an adequate necessary amount without excess or shortage can be previously retained in the probe, thereby enabling to efficiently perform adequate soldering work of the probe.

Further, an arm portion extending laterally from the rising portion can be provided in the probe body. The terminal end of the arm portion defines the front end of the probe body, and the front end can be provided with a tip projecting longitudinally to the side opposing the side where the base end is located. By providing such an arm portion in the probe body, the tip can be adequately engaged with an electrode of a device under test by proper flexing deformation accompanying the elasticity of the arm portion.

It is desirable to make the probe body of a metal material superior to the tip in tenacity and make the tip of a metal material superior to the probe body in hardness for having the probe tip properly engaged with the electrode, and for enhancing the durability of the probe.

In one example of such a combination of materials, rhodium is used as the material of the tip, and nickel, its alloy or phosphor bronze is used as the material of probe body. It is also possible to use gold as the material of the surface layer and nickel or its alloy as the material of the shield region. In this case, the solder is composed of tin or its alloy.

The surface of the shield region can be oxidized. By this, the solder wettability in the shield region can be further lowered, so that the function of the shield region to prevent the solder from spreading can be further improved.

The probe assembly comprising the support base plate and the probes firmly coupled with the support base plate can be provided by soldering a plurality of probes according to the present invention onto the support base plate having a plurality of mounting lands respectively corresponding to the probes.

According to the present invention, as mentioned above, the surface layer of the probe body prevents unnecessary wetting and spread of the solder and enables the solder to retain a proper fillet shape in the soldered portion, thereby surely soldering the probes onto the support base plate to obtain a stable solder bond strength therebetween.

DETAILED DESCRIPTION

The present invention is explained in the following according to the illustrated embodiments.

Figure 1:
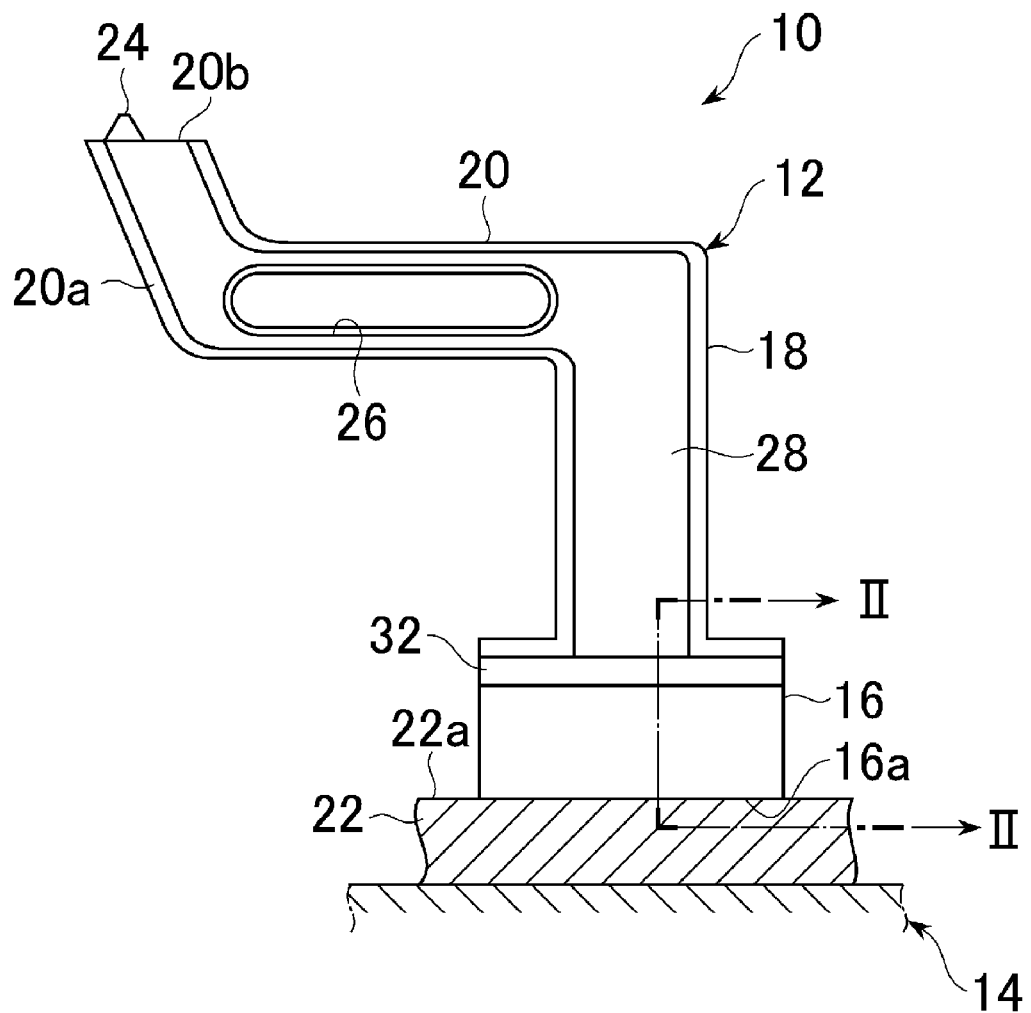
FIG. 1 is a front elevation showing an embodiment of a probe of the present invention.

As shown in FIG. 1, a probe 10 according to the present invention is provided with a generally plate-like probe body 12. The probe body 12 is provided with a mounting portion 16 which is a connecting portion to a support base plate 14, a rising portion 18 which rises from the mounting portion in plane with the mounting portion 16, and an arm portion 20 extending horizontally in the lateral direction from the top of the rising portion in plane with both mounting and rising portions 16 and 18. The arm portion 20 terminates at a front end face 20b through a curved portion 20a which curves toward the side opposing the side where the mounting portion 16 is located.

In the illustration, the rising portion 18 rises at right angle from the mounting portion 16, but it may rise from the mounting portion 16 at an angle different from 90°.

The end face 16a of the mounting portion 16 serves as a base end of the probe body 12 and as a mounting face on a land portion 22a formed in a wiring path 22 on the support base plate 14. The rising portion 18 rises from the mounting portion 16 from the opposite side to the end face 16a. The arm portion 20 is also continuous with the mounting portion 16 through the rising portion 18, and its front end face 20b defines the front end of the probe body 12. According to the illustration, in the front end face 20b, a tip 24 projecting from the front end face is formed by another member partially embedded in the probe body 12.

The probe body 12 is made of a metal material having a relatively high tenacity such as, for example, nickel, its alloy or phosphor bronze. In the illustration, a long hole 26 penetrating in the thickness direction of the arm portion 16 and extending longitudinally thereof is formed so as to enhance the flexibility of the arm portion 16. As is heretofore well known, the probe body 12 can be formed by using a photolithography technique using selective exposure of a photo resist and a development process, and a plating technique such as an electroforming to deposit a metal material on a pattern formed by selective exposure and development of the photo resist.

The tip 24 can be made of the same metal material as the probe body 12 integrally with the probe body 12. To improve the durability, however, it is preferable, as shown in the illustration, to make the tip 24 of a pyramidal shape of a metal material having a higher hardness than that of the probe body 12 and bury this tip 24 within the front end portion of the arm portion 20. Thus, the durability of the tip can be enhanced without spoiling the flexibility of the probe body 12.

Figure 2:
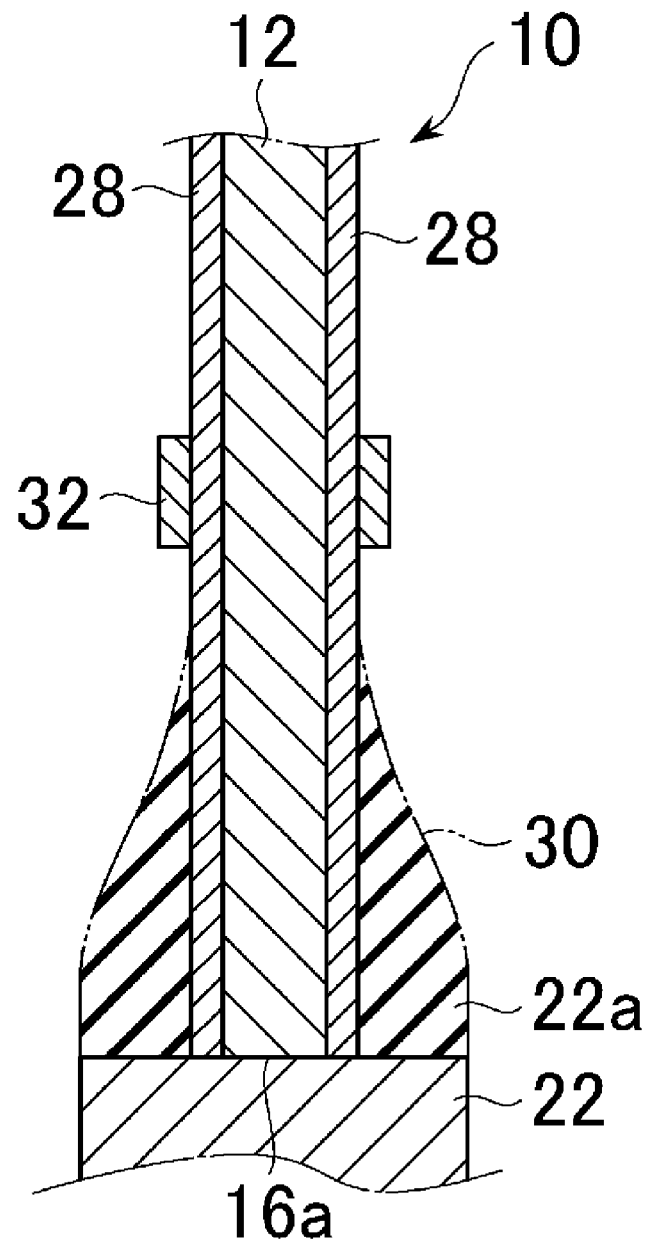
FIG. 2 is a section obtained along the line II-II in FIG. 1.
Figure 3:
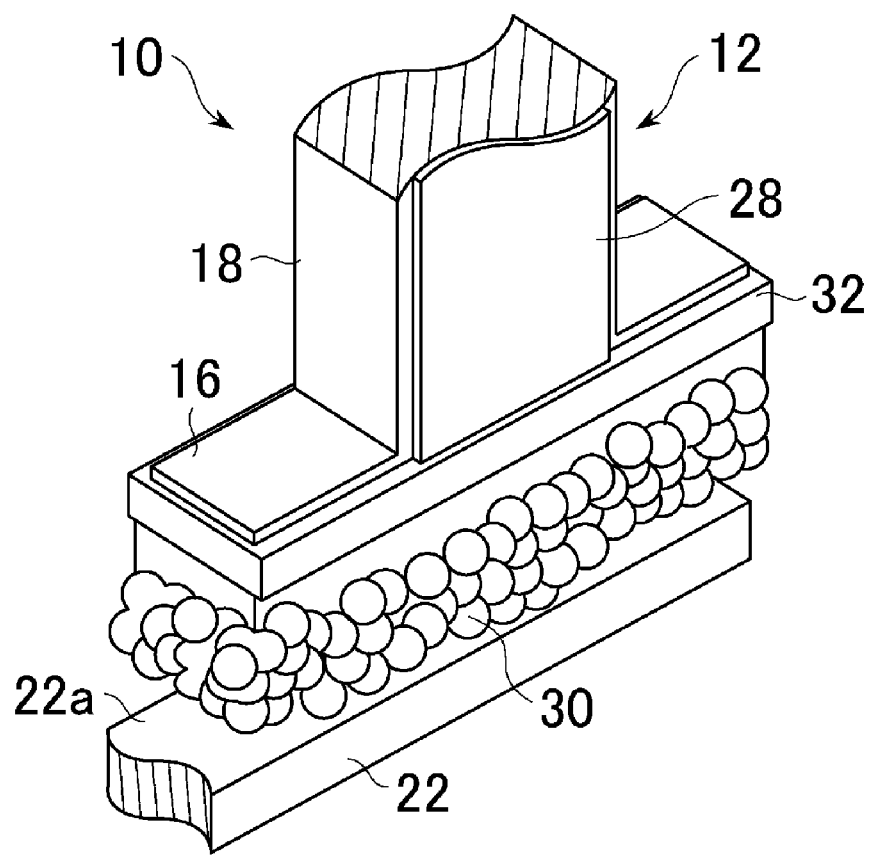
FIG. 3 is a partial perspective view schematically showing a connecting process of the probe of the present invention to an electric wiring path.

In order to enhance the conductivity of the probe 10, as shown in FIGS. 2 and 3, a surface layer 28 showing a higher conductivity than that of the probe body is formed on both faces of the probe body 12. This surface layer 28 can be made of gold on the probe body 12, for example, by electroplating.

The solder 30 made of a conductive adhesive material which can melt such as a simple substance of tin or tin alloy shows a higher wettability to the gold constituting the surface layer than to the metal material constituting the probe body 12. In other words, the surface layer 28 shows a high solder wettability in comparison with the probe body 12. As a tin alloy, an alloy of tin with either one or more of gold, silver, cupper and bismuth can be named.

The surface layer 28 showing a high wettability is formed, as shown in FIG. 3, to surround the periphery of the mounting portion 16 of the probe body 12 and cover the mounting portion. Also, as shown in FIG. 1, the surface layer 28 is continuously formed to cover both faces of the probe body 12 in the region from the mounting portion 16 through the rising portion 18 and the arm portion 20 to the front end face 20b and comes into electrical contact with the tip 24 at the front end face 20b. This surface layer 28 is not necessarily directly connected to the tip 24b on the front end face 20b, and it contributes to improvement in conductivity of the probe 10 so long as it functions as a partial conductive bypass of the probe body 12.

On the surface layer 28 covering the mounting portion 16, a strip-like shield region 32 is formed near the rising portion 18 in the mounting portion 16 so as to cross the surface layer 28 extending along the rising portion 18. This shield region 32 permits the surface layer 28 to expose a broad area for a coupling face of the solder 30 on the side of the end face 16a of the mounting portion 16 rather than the side of the shield region.

The shield region 32 can be made of the same metal material as that of the probe body 12, for example, a plating layer of nickel or its alloy. Being made of the same material as that of the probe body 12, the shield region 32 shows a wettability lower than that of the surface layer 28. While this shield region 32 lowers the wettability even by native oxidation, the wettability can be further lowered rapidly, for example, by heat treatment at 200° C. for three hours.

In order to connect the probe 10 according to the present invention to the land portion 22a in the wiring path 22 of the support base plate 14, as shown in FIG. 3, a proper amount of the solder 30 is applied to a region exposed from the shield region 32 on the side of the end face 16a rather than the side of the shield region 32 in a part covering the peripheral plane of the mounting portion 16 of the surface layer 28. The solder-applied probe 10 is secured to the land portion 22a after melting the solder 30, for example, by a laser beam with the end face 16a abutted on the land portion 22a, and by solidifying the solder 30, whereby the probe 10 is supported on the support base plate 14 in a cantilever state.

Figure 8:
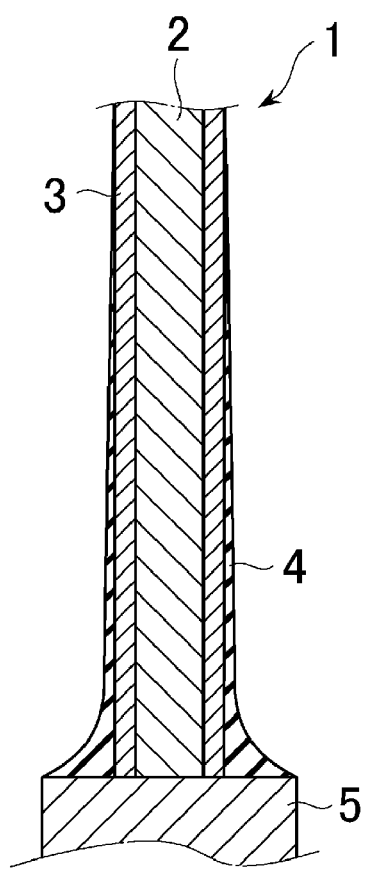
FIG. 8 is a view similar to FIG. 2 showing a conventional probe.

If the above-mentioned shield region 32 is not present on the surface layer 28, as explained as a conventional art in line with FIG. 8, the wettability of the rolled gold layer 3 causes the melted solder 4 to spread largely in a direction to be away from the wiring path 5. Also, due to the gravity, this liquidized solder 4 is caused to form downward droop. As mentioned above, however, due to great wettability of the rolled gold layer 3, the solder 4 wetting and spreading in a broad area does not largely spread out of the probe body 2 in the vicinity of the joint face between the wiring path 5 and the probe 1, and the solder 4 while solidifying as the temperature falls does not spread largely out of the probe body 2 in the vicinity of the joint face between the wiring path 5 and the probe 1, but the solidified solder 4 just forms a thin fillet portion.

On the other hand, according to the present invention, as shown in FIG. 2, the shield region 32 with low wettability is prevented from spreading along the rising portion 18 on the surface layer 28 beyond the shield region. Thus, there is no spreading of the melted solder 30 to wet more than necessary up to a region distant from the joint portion between the land portion 22a and the end face 16a of the probe body 12. Therefore, the solder 30 forms a favorable fillet shape stretching out of the surface of the probe body 12 in the vicinity of the joint portion by its solidification. Thus, a favorable and stable coupling of the probe 10 and the support base plate 14 can be achieved.

Figure 4:
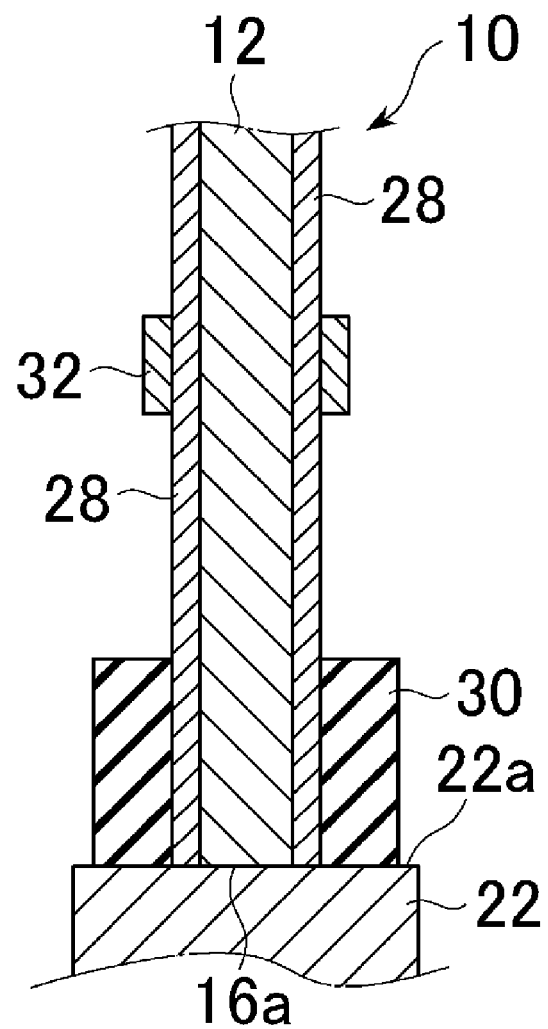
FIG. 4 is a view similar to FIG. 2 showing another embodiment of the probe of the present invention.

In place of applying the solder 30 to the probe 10 when coupling the probe 10 with the support base plate 14, it is desirable, as shown in FIG. 4, to pre-form the solder 30 as a plating layer on the surface layer 28 which is exposed from the shield region 32 at this mounting portion 16. This plating layer 30 can be formed, for example, by a plating method using the electroforming technique. In the solder layer 30, the amount of the solder to be expressed by the product of its thickness and area on the surface layer 28 where the solder plating layer is formed can be accurately controlled. Consequently, by pre-forming the solder layer 30 in each probe 10, an adequate amount of solder can be easily supplied to each probe 10 without excess or shortage. Thus, the plating layer, being capable of surely preventing the solder from extruding, is effective particularly to the probes arranged at narrow pitches.

Figure 5:
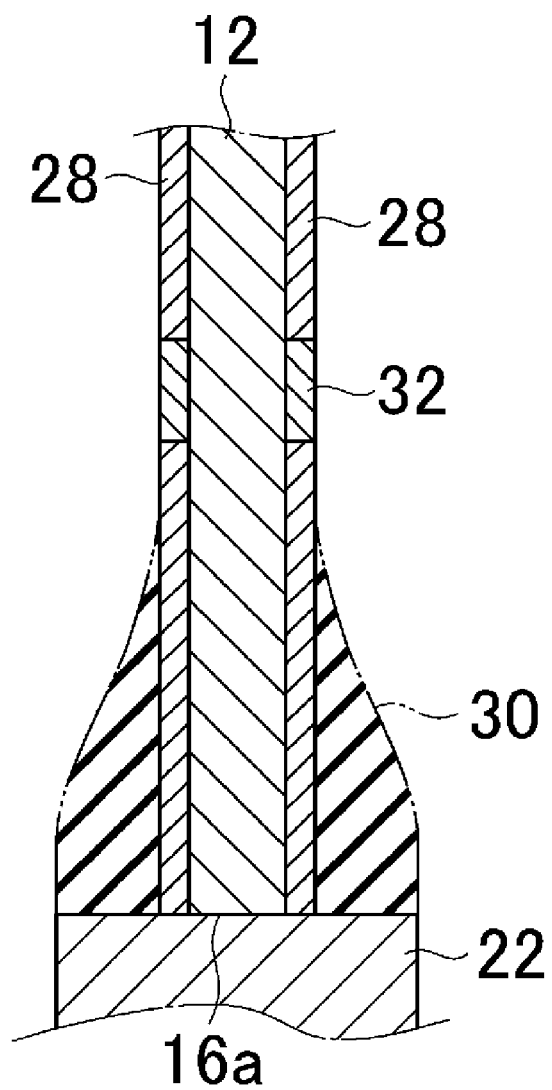
FIG. 5 is a view similar to FIG. 2 showing still another embodiment of the probe of the present invention.

In place of forming the shield region 32 on the surface layer 28, it is possible, as shown in FIG. 5, to provide an annular region for exposing the surface of the probe body 12 so as to divide the surface layer 28 and embed the shield region 32 in the annular region. In this case, a cable run by the surface layer 28 is divided by the shield region 32 which is lower in conductivity than the surface layer 28, but since the surface layer 28 functions as a partial conductive bypass of the probe body 12 as mentioned above, the surface layer 28 contributes to improving the conductivity of the probe 10.

It is desirable, however, just as illustrated in FIGS. 1 through 4, to form a shallow annular dented groove (not shown) which does not expose the surface of the probe body 12 in the surface layer 28 in order to surely improve the conductivity by the surface layer 28 and to accommodate the shield region 32 in the dented groove.

Figure 6:
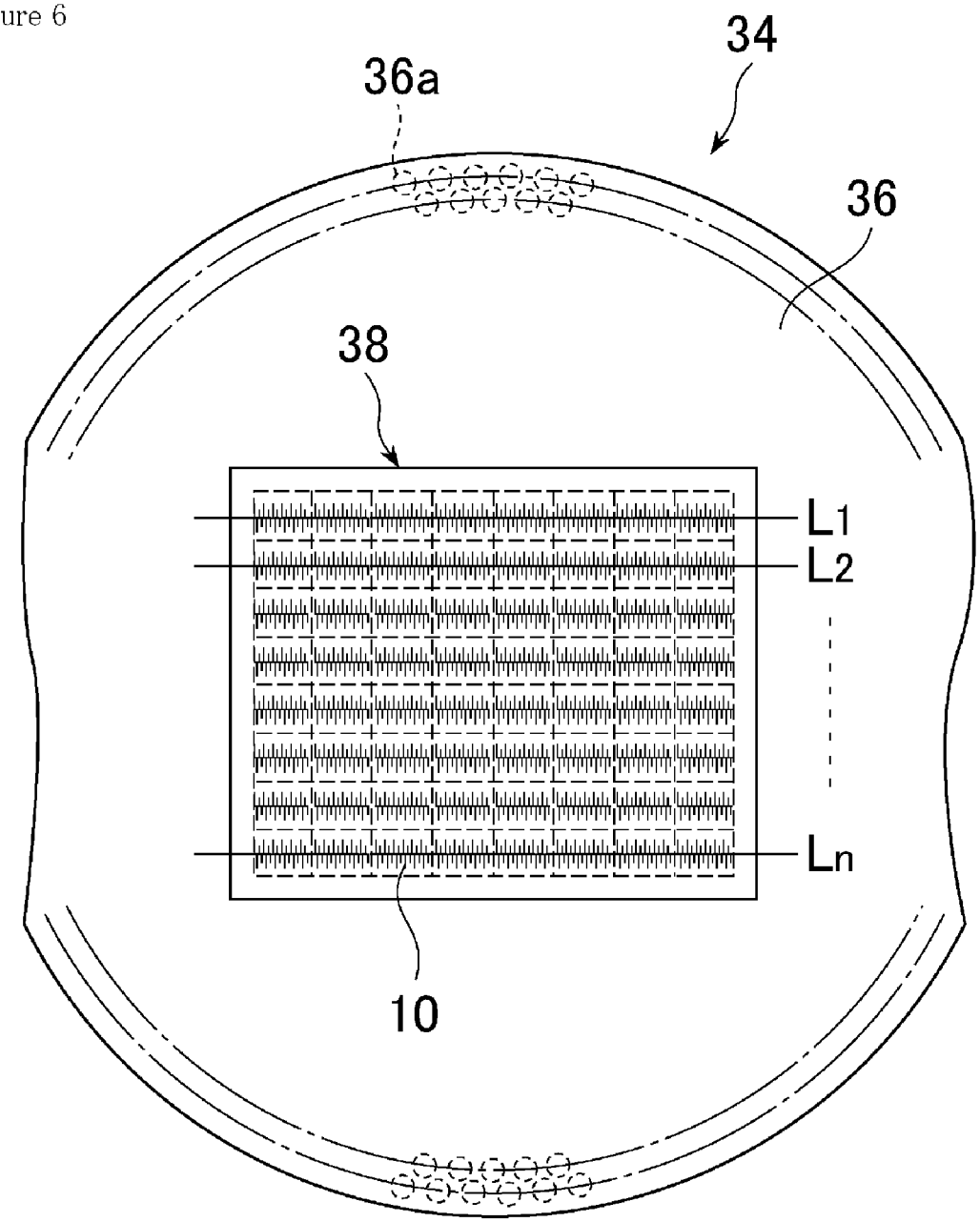
FIG. 6 is a bottom view of the probe assembly with the probes of the present invention incorporated therein.
Figure 7:
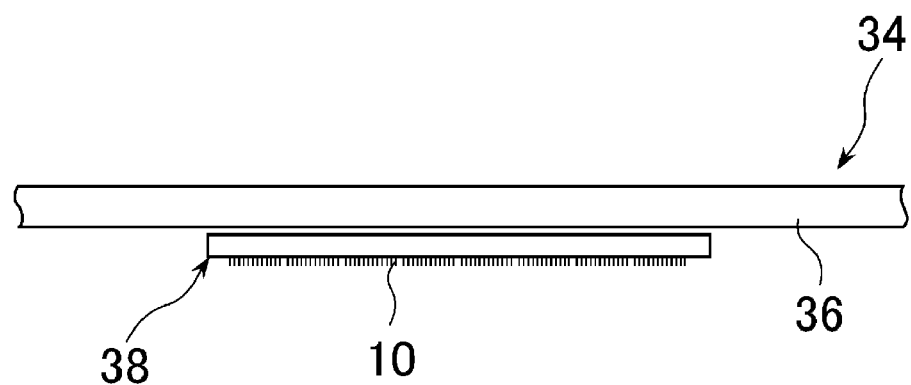
FIG. 7 is a front elevation of the probe assembly with the probes of the present invention incorporated therein.

The above-mentioned probe 10 can be used in a probe assembly 34 shown in FIGS. 6 and 7.

This probe assembly 34 is applied to a continuity test of, for example, a semiconductor integrated circuit such as plural semiconductor chips arranged in a matrix state on a semiconductor wafer not shown. As shown in FIGS. 6 and 7, the probe assembly 34 comprises a circular wiring base plate 36, and a rectangular probe base plate 38 disposed on the underside of the wiring base plate. As shown in FIG. 6, a plurality of tester lands 36a to be connected to a tester (not shown) for electrical test are formed on the upside of the wiring base plate 36.

The probe base plate 38 has an electrical insulation plate such as, for example, ceramic not shown but well known heretofore, and a plurality of wiring paths 22 are formed on the underside of the insulation plate (see FIGS. 1-5). Each wiring path 22 is electrically connected to its corresponding tester land 36a. Also, the probe 10 is adhered to the probe land portion 22a formed in each wiring path 22 (see FIGS. 1-5).

In the example shown in FIG. 6, tips 24 are arranged to be inserted alternately from both sides in each of lines L1-Ln such that the above-mentioned plural probes 10 are arranged with their tips 24 aligned along the plural lines L1-Ln.

By the probes 10 according to the present invention, even in a very narrow pitch alignment to correspond to the semiconductor chips, each probe can be surely soldered to the land portion 22a of the corresponding wiring path 22 without short-circuiting at a soldered portion between adjacent probes 10.

The present invention is not limited to the above embodiments but can be variously modified without departing from its purport.

What is claimed is:

1. A probe for electrical test comprising:
   a probe body having a base end attached to a support base plate through a solder and having a front end continuous with the base end; and
   a surface layer showing a conductivity higher than that of said probe body and a solder wettability higher than that of said probe body, said surface layer extending from said base end to said front end on the surface of said probe body, wherein in the vicinity of said base end of said surface layer, an annular channel in said surface layer terminating at said probe body extends around said probe body, and a shield region with the solder wettability smaller than that of said surface layer is formed in said annular channel, flush with said surface layer.

2. A probe claimed in claim 1, wherein said probe body has a mounting portion including said base end, and a rising portion extending from said mounting portion to the side opposing the side where said base end is located, wherein said shield region is formed in the vicinity of said rising portion in said mounting portion so as to prevent said solder from spreading to wet from said mounting portion to said rising portion.

3. A probe claimed in claim 1, wherein said probe body is formed in a flat plate-like state so that said mounting portion and said rising portion are formed flush with each other, and wherein said surface layer is continuously formed along at least one face of said probe body from said mounting portion to said rising portion.

4. A probe claimed in claim 1, wherein said solder is formed as a solder layer on said surface layer closer to the side of said base plate rather than to said shield region in said mounting portion prior to mounting of said probe body on said support base plate.

5. A probe claimed in claim 1, wherein said probe body further has an arm portion extending laterally from said rising portion, its terminal end defining said front end, and wherein said front end is provided with a tip projecting longitudinally to the side opposing the side where said base end is located.

6. A probe claimed in claim 1, wherein said probe body is made of a metal material superior to said tip in high tenacity, and wherein said tip is made of a metal material superior to said probe body in hardness.

7. A probe claimed in claim 5, wherein said probe body is made of nickel, its alloy or phosphor bronze, said surface layer is made of gold, said shield region is made of nickel or its alloy, and wherein said solder is made of tin or its alloy.

8. A probe claimed in claim 6, wherein the surface of said shield region is oxidized so as to further lower the solder wettability.

9. A probe assembly comprising a support base plate having a plurality of mounting lands, and the plural probes claimed in claim 1 with their base ends attached like a cantilever to the corresponding attachment lands through a solder.

* * * * *